(12) United States Patent
Boyd

(10) Patent No.: US 9,150,418 B2
(45) Date of Patent: Oct. 6, 2015

(54) METHOD AND SYSTEM FOR GRAPHENE FORMATION

(71) Applicant: California Institute of Technology, Pasadena, CA (US)

(72) Inventor: David A. Boyd, La Cañada Flintridge, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 22 days.

(21) Appl. No.: 13/774,188

(22) Filed: Feb. 22, 2013

(65) Prior Publication Data

US 2014/0044885 A1 Feb. 13, 2014

Related U.S. Application Data

(60) Provisional application No. 61/603,104, filed on Feb. 24, 2012, provisional application No. 61/607,337, filed on Mar. 6, 2012, provisional application No. 61/677,323, filed on Jul. 30, 2012.

(51) Int. Cl.
| | |
|---|---|
| C23C 14/02 | (2006.01) |
| C01B 31/04 | (2006.01) |
| B01J 19/12 | (2006.01) |
| C07C 9/04 | (2006.01) |
| B01J 19/08 | (2006.01) |

(Continued)

(52) U.S. Cl.
CPC ........... C01B 31/0453 (2013.01); B01J 19/088 (2013.01); B01J 19/12 (2013.01); B01J 19/22 (2013.01); B82Y 30/00 (2013.01); B82Y 40/00 (2013.01); C07C 9/04 (2013.01); B01J 2219/0879 (2013.01); B01J 2219/0894 (2013.01)

(58) Field of Classification Search
CPC .. C01B 31/0446; C01B 31/0453; C23C 16/26
See application file for complete search history.

(56) References Cited

U.S. PATENT DOCUMENTS

| | | | |
|---|---|---|---|
| 7,604,708 B2 * | 10/2009 | Wood et al. | 156/345.35 |
| 2009/0214800 A1 * | 8/2009 | Saito | 427/577 |

(Continued)

FOREIGN PATENT DOCUMENTS

| | | | |
|---|---|---|---|
| CN | 1762039 A | 4/2006 | |
| EP | 1661855 * | 5/2006 | C01B 31/02 |

(Continued)

OTHER PUBLICATIONS

Liu et al., "Synthesis of high-quality monolyaer and bilayer graphene on copper using chemical vapor deposition", Carbon 49 (2011), pp. 4122-4130.*

(Continued)

*Primary Examiner* — Michael Wieczorek
(74) *Attorney, Agent, or Firm* — Kilpatrick Townsend & Stockton LLP

(57) ABSTRACT

A method for forming graphene includes providing a substrate and subjecting the substrate to a reduced pressure environment. The method also includes providing a carrier gas and a carbon source and exposing at least a portion of the substrate to the carrier gas and the carbon source. The method further includes performing a surface treatment process on the at least a portion of the substrate and converting a portion of the carbon source to graphene disposed on the at least a portion of the substrate.

30 Claims, 8 Drawing Sheets

(51) Int. Cl.
  *B01J 19/22* (2006.01)
  *B82Y 30/00* (2011.01)
  *B82Y 40/00* (2011.01)

(56) References Cited

U.S. PATENT DOCUMENTS

| | | | |
|---|---|---|---|
| 2010/0200839 A1* | 8/2010 | Okai et al. | 257/29 |
| 2010/0247801 A1* | 9/2010 | Zenasni | 427/554 |
| 2010/0323113 A1 | 12/2010 | Ramappa et al. | |
| 2011/0033688 A1* | 2/2011 | Veerasamy | 428/220 |
| 2011/0108609 A1* | 5/2011 | Woo et al. | 228/176 |
| 2011/0114499 A1* | 5/2011 | Hori et al. | 205/341 |
| 2011/0143034 A1 | 6/2011 | Ahn et al. | |
| 2012/0088039 A1* | 4/2012 | Yu et al. | 427/596 |
| 2013/0052119 A1* | 2/2013 | Kim et al. | 423/445 B |

FOREIGN PATENT DOCUMENTS

| | | |
|---|---|---|
| KR | 10-2012-0012271 A | 2/2012 |
| TW | 201336784 A | 9/2013 |
| WO | WO 2011/115197 * 9/2011 | C23C 16/26 |
| WO | WO 2011-115197 A1 | 9/2011 |
| WO | WO 2013/027284 A1 | 8/2013 |

OTHER PUBLICATIONS

Kim, Jaeho et al., "Low-temperature synthesis of large-area graphene-based transparent conductive films using surface wave plasma chemical vapor deposition", Applied Physics Letters 2011, vol. 98, Article 091502 (3 pages). (Mar. 2, 2011).

Notification of Transmittal of the International Search Report and the Written Opinion of the International Searching Authority, or the Declaration and International Search Report and Written Opinion of the International Searching Authority for International Application No. PCT/US2013/027284 mailed on Jun. 10, 2013, 13 pages.

English Translation and Office Action and Search Report for corresponding Taiwanese Patent Application No. 102106432 dated Jul. 25, 2014, 23 pages.

* cited by examiner

METHOD AND SYSTEM FOR GRAPHENE FORMATION

CROSS-REFERENCES TO RELATED APPLICATIONS

This application claims priority to U.S. Provisional Patent Application No. 61/603,104, filed on Feb. 24, 2012, entitled "Method for Forming Graphene at Reduced Processing Temperatures," U.S. Provisional Patent Application No. 61/607,337, filed on Mar. 6, 2012, entitled "Method for Forming Graphene at Reduced Processing Temperatures," and U.S. Provisional Patent Application No. 61/677,323, filed on Jul. 30, 2012, entitled Single-Step Method for Forming High Quality, Large Area Graphene at Reduced Temperature," the disclosures of which are hereby incorporated by reference in their entirety for all purposes.

BACKGROUND OF THE INVENTION

Graphene is an allotrope of carbon in which the atoms are arrayed in a single atom sheet in a regular hexagonal pattern. The electronic properties of graphene differ from conventional three dimensional materials and graphene can be considered as a zero bandgap semiconductor. Graphene can have a high carrier mobility at room temperature, making graphene a candidate material for electronic circuit applications.

Current methods of forming graphene films include chemical vapor deposition (CVD) at high temperatures, for example, ~1,000° C. CVD growth techniques may also include pre-growth exposure to hydrogen at high temperatures (e.g., ~1,000° C.).

Despite the progress made related to the formation of graphene films, there is a need in the art for improved methods and systems related to graphene production.

SUMMARY OF THE INVENTION

The present invention relates generally to methods and systems for material synthesis. More specifically, the present invention relates to methods and systems for growing high quality, large area graphene. Merely by way of example, the invention has been applied to a method of growing graphene at room temperature under a reduced pressure atmosphere. The methods and techniques can be applied to a variety of graphene growth systems including CMOS compatible semiconductor growth processes.

According to an embodiment of the present invention, a method of forming a film of graphene is provided. The method includes placing a substrate in a processing chamber at a reduced pressure and performing a surface treatment process on at least a portion of the substrate. The method also includes providing a carbon containing material in the processing chamber and exposing the substrate to the carbon containing material. The method further includes converting a portion of the carbon containing material to a film of graphene on the substrate.

According to another embodiment of the present invention, a method for forming graphene is provided. The method includes providing a substrate and subjecting the substrate to a reduced pressure environment. The method also includes providing a carrier gas and a carbon source and exposing at least a portion of the substrate to the carrier gas and the carbon source. The method further includes performing a surface treatment process on the at least a portion of the substrate and converting a portion of the carbon source to graphene disposed on the at least a portion of the substrate.

According to a particular embodiment of the present invention, a system for graphene production is provided. The system includes a plurality of gas sources, a plurality of mass flow controllers, each of the plurality of mass flow controllers coupled to one of the plurality of gas sources, and a processing chamber in fluid communication with the plurality of mass flow controllers. The system also includes a plasma source operable to form a plasma in the processing chamber and a vacuum pump in fluid communication with the processing chamber. The system further includes a processor and a non-transitory computer-readable storage medium comprising a plurality of computer-readable instructions tangibly embodied on the computer-readable storage medium, which, when executed by a data processor, provide for graphene production. The plurality of instructions include instructions that cause the data processor to subject a substrate to a reduced pressure environment and instructions that cause the data processor to provide a carrier gas and a carbon source. The plurality of instructions also include instructions that cause the data processor to expose at least a portion of the substrate to the carrier gas and the carbon source and instructions that cause the data processor to perform a surface treatment process on the at least a portion of the substrate. The plurality of instructions further include instructions that cause the data processor to convert a portion of the carbon source to graphene disposed on the at least a portion of the substrate.

Numerous benefits are achieved by way of the present invention over conventional techniques. For example, embodiments of the present invention provide techniques for producing graphene without the need for a furnace. Additionally, as described herein, graphene growth can be achieved more rapidly than provided by conventional techniques. Moreover, the low thermal budget processes described herein enable the growth of graphene characterized by lower stress than that observed in graphene grown using conventional methods. Some embodiments of the present invention provide methods and systems for producing graphene without the use of a furnace, enabling growth to be achieved at a more rapid rate than using conventional techniques, significantly reducing growth times (e.g., from 5 hours to 15 minutes) while producing low stress graphene films. These and other embodiments of the invention along with many of its advantages and features are described in more detail in conjunction with the text below and attached figures.

DETAILED DESCRIPTION OF SPECIFIC EMBODIMENTS

The present invention relates generally to methods and systems for material synthesis. More specifically, the present invention relates to methods and systems for growing high quality, large area graphene. Merely by way of example, the invention has been applied to a method of growing graphene at room temperature under a reduced pressure atmosphere. The methods and techniques can be applied to a variety of graphene growth systems including CMOS compatible semiconductor growth processes.

According to embodiments of the present invention, methods and systems for graphene production are provided. In an embodiment, the process includes subjecting a substrate (e.g., a copper foil) to a hydrogen plasma prior to the introduction of carbon precursors. This process is performed under a reduced pressure atmosphere. This process avoids the high temperature hydrogen anneal utilized in conventional graphene growth. Accordingly, the present invention enables the growth of high quality graphene at low temperature (e.g., room temperature) to enable low temperature processing without either pre-growth high temperature annealing in hydrogen or high temperatures during growth.

The high processing temperatures (e.g., ~1,000° C.) utilized in conjunction with conventional methods for forming graphene by CVD ultimately produce adverse consequences for device performance. Lower thermal budgets are desirable, reducing energy costs for production and potentially producing graphene films with reduced stress. Additionally, lower thermal budgets can open up new avenues for device integration. High processing temperatures are conventionally used either during hydrogen annealing performed prior to growth and during CVD growth. For CVD growth on copper films, annealing in hydrogen is believed to clean the copper surface by removing the native copper oxide layer and providing access to elemental copper on which the graphene layer grows. The substrate cleaning produced during a high temperature hydrogen anneal is evidenced by the build-up of copper on the inside of the processing tube.

An alternative method for cleaning a surface is through the use of a plasma (e.g., a microwave plasma), which enables substrate cleaning to be performed without the application of high temperature to the processing environment. Without limiting embodiments of the present invention, the inventor believes that the energetic species in the plasma serve to remove the native oxide layer present on the copper substrate.

According to an embodiment of the present invention, a method for growing high quality graphene using a lower thermal budget process compared to conventional methods is provided. In this embodiment, the conventional high temperature hydrogen anneal is replaced with a room temperature plasma clean before the start of the CVD growth. Accordingly, the overall thermal budget of the process is reduced in comparison with conventional techniques.

Figure 1:
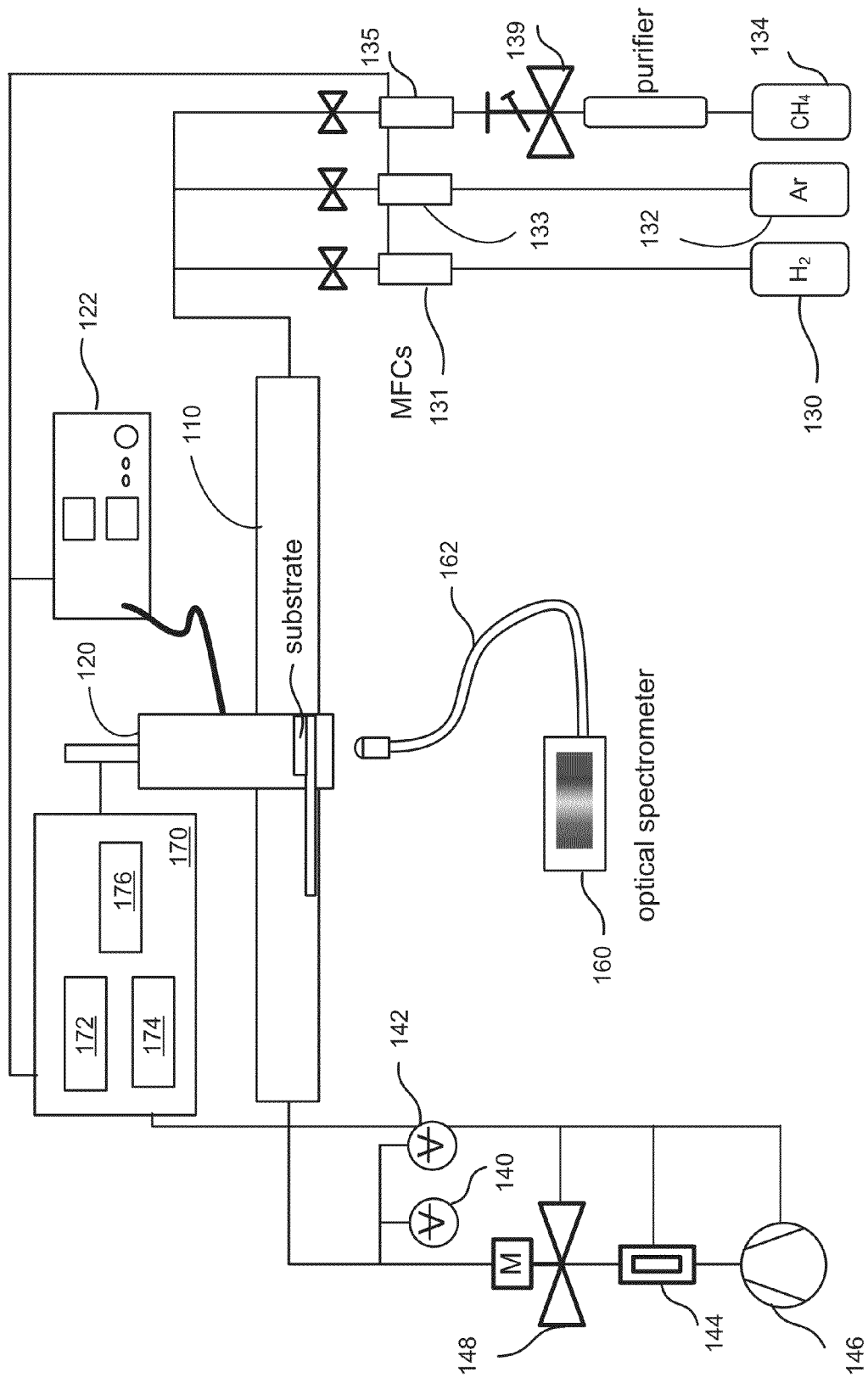
FIG. 1 is a simplified schematic diagram illustrating a system for graphene production according to an embodiment of the present invention.

FIG. 1 is a simplified schematic diagram illustrating a system for graphene production according to an embodiment of the present invention. The system includes a processing chamber 110. The processing chamber can also be referred to as a processing tube. The processing chamber is fabricated from materials such as quartz that provide a non-reactive environment that will sustain plasma generation. In addition to quartz, other materials, including alumina, glass, and the like can be utilized in fabricating the processing chamber. An RF plasma generator 120 (e.g., an Evenson cavity suitable for generating a microwave plasma) and an associated power supply 122 are provided in order to generate an RF plasma (e.g., a microwave plasma in the ultra high frequency (UHF) portion of the RF spectrum) in a portion of the processing chamber. The portion of the processing chamber can include all or a fraction of the processing chamber depending on the particular implementation.

Gas sources 130, 132, and 134 are illustrated in FIG. 1 and can include fewer or a greater number of sources. In the illustrated embodiment, the gas sources are $H_2$, Ar, and $CH_4$ although the present invention is not limited to these particular gases. Mass flow controllers (MFCs) 131, 133, and 135 or other suitable flow controllers are utilized to control the flow rate of the gases from the gas sources to the processing chamber.

A leak valve 139 is illustrated in FIG. 1 and can be used to control the flow of the carbon source at levels below that provided by MFCs. In some embodiments, MFC 135 is operated in an open condition and the flow of the carbon source can be controlled using a feedback loop incorporating a feedback signal from optical spectrometer 160. Alternatively, a pre-mixture of $H_2$ and $CH_4$ (or other suitable carbon source) could be utilized. Accordingly, some embodiments utilize the optical emission spectra to adjust the amount of the carbon source (e.g., methane) in the stream since the optical emission spectra can be sensitive to very small changes in the position of the leak valve.

In order to monitor the pressure in the processing chamber 110, one or more pressure gauges 140 and 142 can be utilized in the vacuum lines leading to the foreline trap 144 and the vacuum pump 146. Additional vacuum elements can be utilized as appropriate to the particular application. Additionally, one or more vacuum control valves 148 can be utilized to control the pressure in the processing chamber.

In order to provide for characterization of the processing environment and the graphene formation process, an optical spectrometer 160 is provided, illustrated as optically coupled to the processing chamber using a fiber optic cable 162. In addition to optical emission spectrometers (OES), which can be used to control and adjust the amount of the carbon source in the flow stream, the OES can be used to measure the emission peaks. In some embodiments, a ratio of a set of emission peaks can be used to monitor the growth process and produce consistent results. In other implementations, an optical pyrometer is used to measure the sample temperature. In some embodiments, an optical inspection system (for example, a mirror that provides optical access to one or more surfaces of the substrate) is utilized during growth to characterize the state of copper removal. Thus, in addition to an optical spectrometer, other optical inspection techniques are included within the scope of the present invention.

A computer 170 including a processor 172 and computer readable medium 174 is provided and coupled to the MFCs, the vacuum control valve 148, the RF plasma generator 120 and power supply 122, the optical emission spectrometer (OES) 160, and other suitable system components in order to provide for control of the various system components. In some implementations, fewer or more components can be coupled to the computer. The processor 172 is used to perform calculations related to controlling at least some of the vacuum pressure, gas flow rates, plasma generation, and other system parameters. A computer readable medium 174 (also referred to as a database or a memory) is coupled to the processor 172 in order to store data used by the processor and other system elements. The processor 172 interacts with the optical spectrometer 160 in some embodiments, which provides data on the state of the substrate cleaning process, graphene deposition process, and the like. Using the processor 172, the memory 174, and the I/O interface 176, a user is able to operate the system to form graphene as described herein.

The processor 172 can be a general purpose microprocessor configured to execute instructions and data, such as a Pentium processor manufactured by the Intel Corporation of Santa Clara, Calif. It can also be an Application Specific Integrated Circuit (ASIC) that embodies at least part of the instructions for performing the method in accordance with the present invention in software, firmware and/or hardware. As an example, such processors include dedicated circuitry, ASICs, combinatorial logic, other programmable processors, combinations thereof, and the like.

The memory 174 can be local or distributed as appropriate to the particular application. Memory 174 may include a number of memories including a main random access memory (RAM) for storage of instructions and data during program execution and a read only memory (ROM) in which fixed instructions are stored. Thus, memory 174 provides persistent (non-volatile) storage for program and data files, and may include a hard disk drive, flash memory, a floppy disk drive along with associated removable media, a Compact Disk Read Only Memory (CD-ROM) drive, an optical drive, removable media cartridges, and other like storage media.

Figure 2:
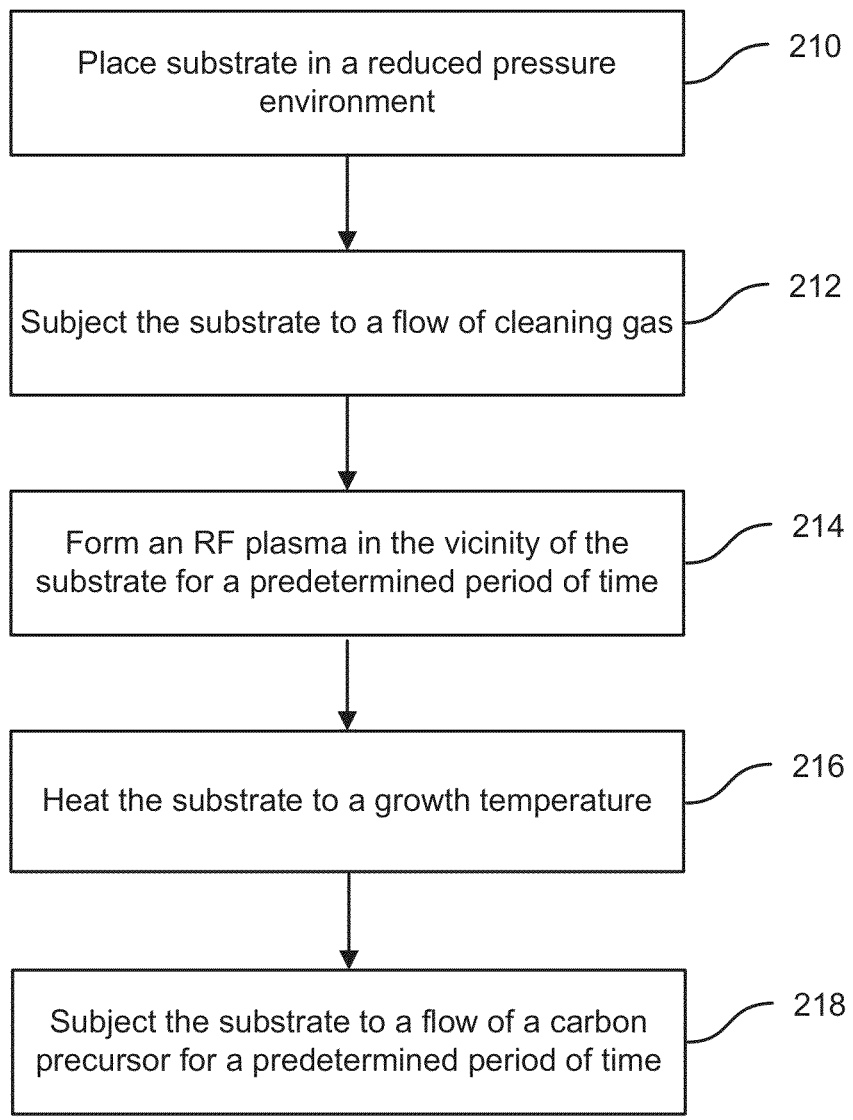
FIG. 2 is a simplified flowchart illustrating a method of growing graphene according to an embodiment of the present invention.

FIG. 2 is a simplified flowchart illustrating a method of growing graphene according to an embodiment of the present invention. The method includes placing a substrate in a reduced pressure environment (210). In an embodiment, the substrate is a copper foil (e.g., 0.025 mm in thickness) and the reduced pressure environment is a vacuum environment (e.g., pressure in the range of 25 mTorr to 0.5 Torr). In some embodiments, the total system pressure is between 25 mTorr and 40 mTorr, but can be lower depending on the particular vacuum systems utilized. During processing, the pressure is maintained at 500 mTorr in some implementations as described more fully herein.

The method also includes subjected the substrate to a flow of cleaning gas (e.g., hydrogen) (212) and forming an RF plasma in the vicinity of the substrate for a predetermined period of time (214). In some embodiments, the temperature of the substrate during RF plasma cleaning is at reduced temperatures compared to the conventional 1,000° C. hydrogen anneal, for example, at or near room temperature. Thus, embodiments of the present invention enable low temperature processing not available using conventional techniques.

After the RF plasma is extinguished, the sample is heated to a growth temperature (e.g., 800° C.) (216). In some embodiments, during the heating process, the substrate is maintained under vacuum conditions with hydrogen flowing to preserve the substrate in an inert environment. Without limiting embodiments of the present invention, the inventor believes that the RF plasma increases the reactivity of the substrate, thereby preparing the substrate for subsequent growth when exposed to carbon containing materials. It should be noted that in some implementations, the vacuum environment (e.g., from 25 mTorr to 0.5 Torr) is such that gases from the ambient atmosphere (including air, nitrogen, and the like) may be present since an ultrahigh vacuum environment is not required by some embodiments. For increased control of the vacuum environment, additional control of the gases present in the processing chamber can be provided as will be evident to one familiar with CVD systems.

The method further includes subjecting the substrate to a flow of a carbon precursor for a predetermined period of time (218). As an example, the carbon precursor can be one of several gaseous species, including methane, acetylene, cyclohexane, toluene, PMMA, polystyrene, benzene, a combination thereof, or the like. After growth, the substrate is cooled and removed from the growth chamber.

It should be appreciated that the specific steps illustrated in FIG. 2 provide a particular method of growing graphene according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 3:
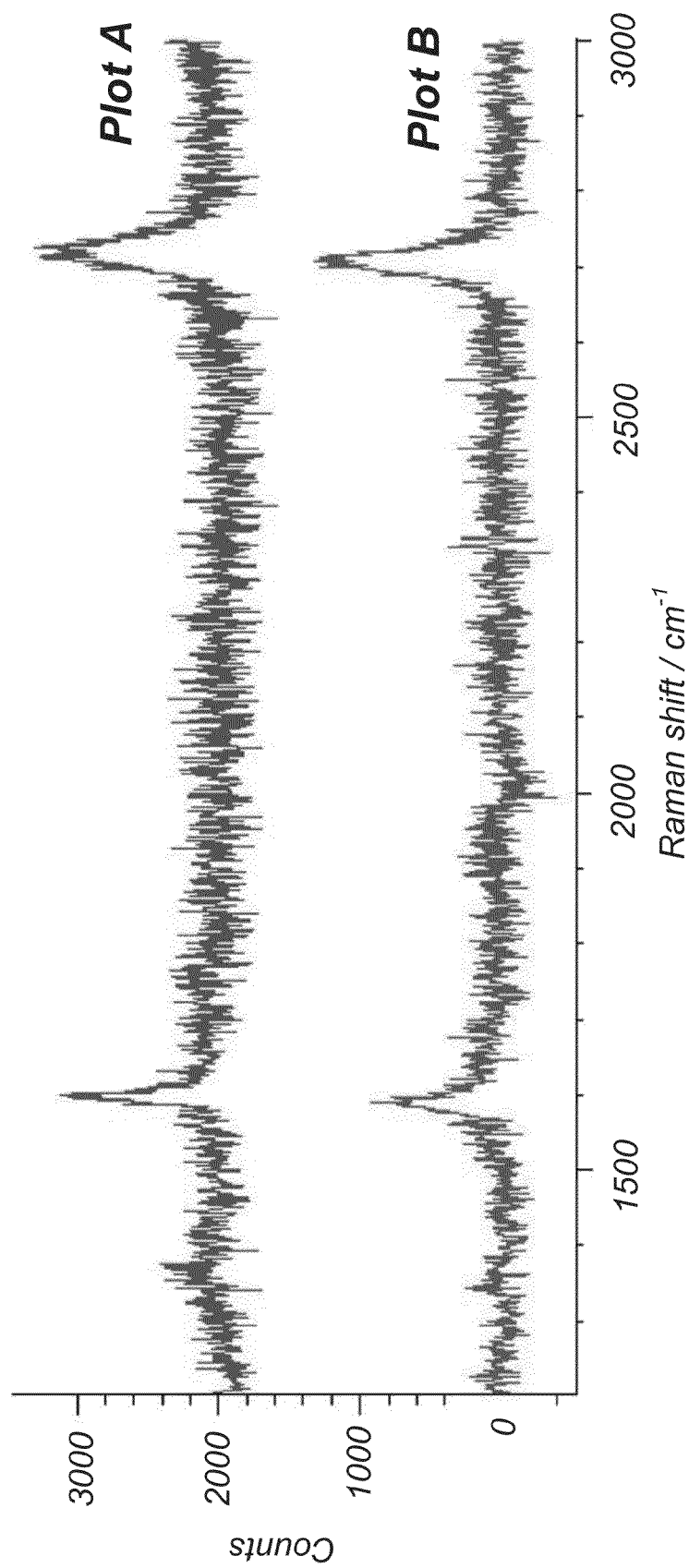
FIG. 3 shows data for a graphene film grown using conventional techniques and for a graphene film grown using an embodiment of the present invention.

Utilizing embodiments of the present invention as discussed in relation to FIG. 2, graphene growth on copper foils has been performed at growth temperatures ranging from about 800° C. to about 1,000° C. Accordingly, growth at temperatures lower than conventional graphene growth temperatures are provided by some embodiments of the present invention. FIG. 3 shows data (i.e., spectral data collected using Raman spectroscopy) for a graphene film grown using conventional techniques (plot A) and for a graphene film grown using the method discussed in relation to FIG. 2 (plot B). As illustrated in FIG. 3, the graphene grown on single crystal copper at 1,000° C. (plot A) and the graphene grown on copper foil using a low temperature plasma clean process followed by 800° C. growth (plot B) are characterized by the two sharp features of the Raman spectra at ~1580 and 2700 cm$^{-1}$ and the absence of a pronounced defect peak at ~1350 cm$^{-1}$, indicating that embodiments of the present invention produce a high quality graphene film utilizing the plasma assist conditions described herein.

In some embodiments utilizing a two-step clean/growth process, the substrate is maintained in an inert environment during the time between the plasma treatment used to clean the surface and the exposure to the carbon source during growth. The ability to keep the substrate in this inert environment (e.g., maintain the process under vacuum) enables the treated surface to remain in the treated state since copper quickly forms an oxide when exposed to oxygen.

Utilizing the system illustrated in FIG. 1, graphene was formed as follows. An RF plasma was formed in the processing chamber in the vicinity of the substrate (a copper foil) using an Evenson cavity with an input power of 40 W for a period of 15 minutes with a flow rate of hydrogen of 2 sccm. During the application of the RF plasma, a significant amount of copper was observed in the vicinity of the microwave cavity, indicating that the RF plasma was etching or otherwise removing copper from the substrate. The RF plasma was extinguished and the substrate was heated under a flow of 2 sccm of hydrogen at 42 mTorr to 800° C.

Subsequently, a flow of $CH_4$ was added at a flow rate of 35 sccm and the total pressure in the processing chamber was increased to 500 mTorr. After 15 minutes of these conditions, the substrate was cooled under the same flow and pressure. Upon cooling, the substrate was removed and Raman spectroscopy was performed (plot A in FIG. 5), demonstrating that graphene had been formed on the backside of the substrate adjacent the susceptor, which can also be referred to as a sample holder. This procedure was repeated at growth temperatures of 700° C. and 600° C. with similar results. In addition to single layers of graphene, embodiments of the present invention are useful for forming other isomorphs of carbon, including multi-layer graphene, carbon nanotubes (e.g., using a VLS process), diamond like carbon, graphite, amorphous carbon, Bucky Balls, and the like. One of ordinary skill in the art would recognize many variations, modifications, and alternatives.

Figure 4:
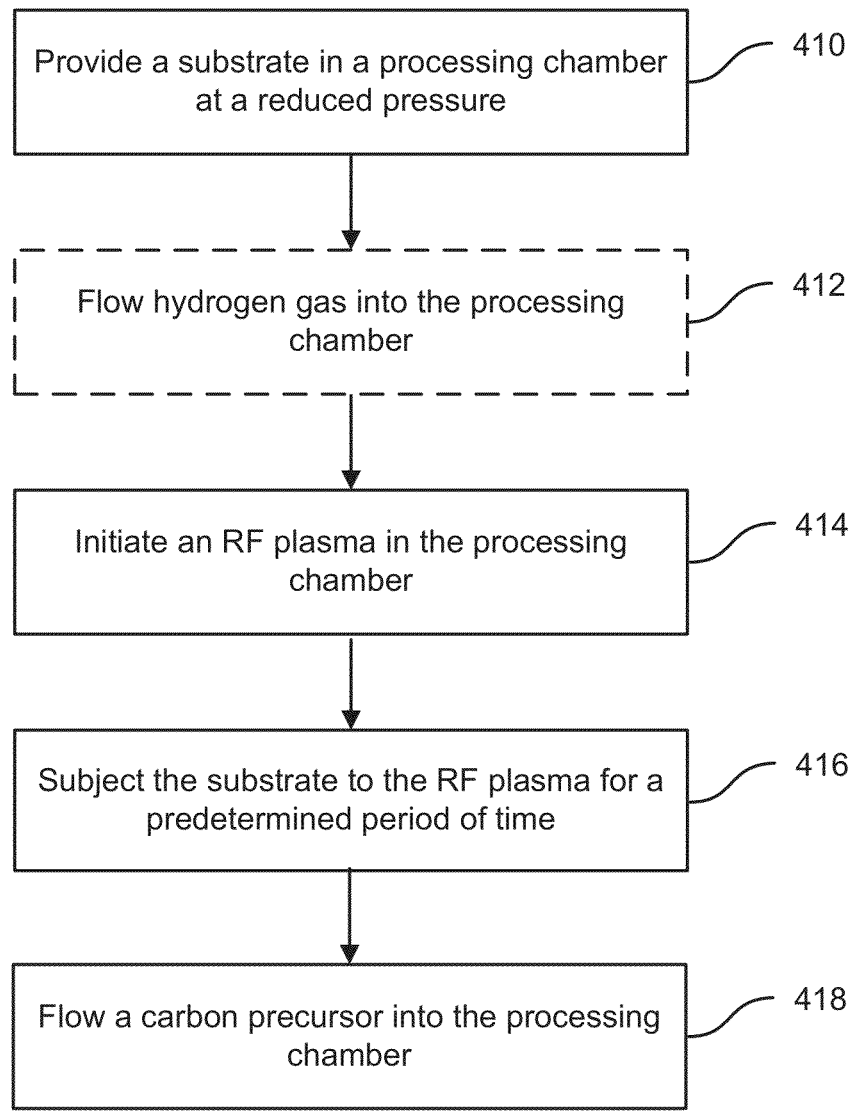
FIG. 4 is a simplified flowchart illustrating a method of growing graphene according to another embodiment of the present invention.

FIG. 4 is a simplified flowchart illustrating a method of growing graphene according to another embodiment of the present invention. The method shares some similar processes with the graphene growth process associated with the Raman spectra in plot A of FIG. 5 and the description related to this high temperature (e.g., 800° C.) growth process is applicable to the growth process illustrated in FIG. 4 as appropriate.

The method includes providing a substrate in a processing chamber at a reduced pressure environment (410). In an embodiment, the substrate can be a copper foil or other suitable substrate and the reduced pressure environment can be a vacuum environment in the processing chamber 110 illustrated in FIG. 1, for example, pressures ranging from about 1 to about 500 mTorr. The pressure can be less than 500 mTorr in some implementations. In some embodiments, the method also includes introducing a flow of hydrogen gas into the processing chamber (412), for example, at a flow rate of 2 sccm. Other gases can also be utilized, including nitrogen, argon, other noble gases, chlorine, other halogens, mixtures of these gases (e.g., chlorine and argon), and the like. Although the gas is flowing through the processing chamber, the application of vacuum to the chamber is sufficient to maintain the reduced pressure environment despite the gas flow. In some embodiments, the pressure in the processing chamber is maintained at a predetermined pressure value, for example, 500 mTorr, for a predetermined time. In order to effectively remove native oxides, the partial pressure of oxygen in the reduced pressure environment can be less than 30 mTorr, the partial pressure of hydrogen in the reduced pressure environment can be less than 500 mTorr, and the partial pressure of inert gases and/or atmospheric gases including water vapor in the reduced pressure environment can be less than 500 mTorr. In other embodiments, the partial pressure of air in the reduced pressure environment can be less than 30 mTorr, the partial pressure of water in the reduced pressure environment can be less than 30 mTorr, or the partial pressure of the carrier gas and the carbon source in the reduced pressure environment can be less than 500 mTorr. In a particular embodiment, the total pressure of the carrier gas and the carbon source in the reduced pressure environment is less than 500 mTorr. One of ordinary skill in the art would recognize many variations, modifications, and alternatives.

Additionally, the method includes initiating an RF plasma in the processing chamber (414) and subjecting the substrate to the RF plasma for a predetermined period of time (416). During the exposure to the RF plasma, the substrate surface is cleaned and/or treated to remove native oxides and prepare the surface for deposition of the graphene. During the RF plasma treatment, the substrate is maintained in a reduced pressure environment, for example, by maintaining vacuum conditions. As an example, the RF plasma (e.g., an RF hydrogen plasma formed in conjunction with the flow of hydrogen in the processing chamber) can be formed in the processing chamber in the vicinity of the substrate (a copper foil) using an Evenson cavity with an input power of 40 W for a period of 15 minutes (e.g., with a flow rate of hydrogen of 2 sccm). During the application of the RF plasma, a significant amount of copper was observed in the vicinity of the microwave cavity, indicating that the RF plasma was etching or otherwise removing copper from the substrate.

After the RF plasma treatment, the plasma is extinguished and the substrate is maintained in a reduced pressure environment, for example, in a low pressure hydrogen environment, with a flow rate of $H_2$ of 2 sccm, resulting in a pressure of 42 mTorr. The method further includes flowing a carbon precursor (e.g., methane) into the processing chamber (418), for example, at a flow rate of 35 sccm of $CH_4$, producing a pressure in the processing chamber of 500 mTorr. Thus, a reduced pressure atmosphere can be maintained while the substrate is exposed to the carbon containing material in some embodiments, for example, at a pressure less than 500 mTorr. The temperature during the flow of the carbon precursor can be room temperature, temperatures below room temperature, or temperatures above room temperature. In a particular embodiment, the temperature during the flow of the carbon precursor is between 20° C. and 30° C., for example, room temperature.

During the flow of the carbon precursor, the pressure in the chamber can be held at a prescribed value (e.g., 42 mTorr) or varied as a function of time depending on the particular application. In some embodiments, a reduced pressure environment is maintained during the flow of the carbon precursor. The flow of the carbon precursor results in the deposition of graphene on the substrate according to embodiments of the present invention, for example, at room temperature. The graphene can be formed on one side or both sides of the substrate depending on the deposition conditions. In some implementations, a cover or cap is utilized in close proximity to the substrate to enhance graphene growth. Without limiting embodiments of the present invention, the inventor believes that the use of a cover or cap can increase the residence time of the species and/or precursors adjacent the substrate surface, impacting the reaction kinetics and thereby increasing the deposition rate. In some embodiments, graphene growth on the backside of the substrate adjacent the susceptor or sample holder is observed. Such enhancements in the graphene growth may be attributed to the low velocity of the methane flow between the substrate and susceptor or sample holder and the corresponding long residence time in comparison with other surfaces that are not covered or capped. Alternatively, the concentration of the carbon source in the gas flow can be decreased to limit the amount of carbon available at the growth surface, thereby enhancing graphene growth.

After a predetermined period of time, the flow rates of the hydrogen and the carbon precursor are decreased, for example, to zero. Because the processing chamber is in communication with vacuum pumps, the processing chamber is evacuated and can be back-filled with argon or other suitable inert gases. Subsequently, the substrate can be removed from the processing chamber to characterize the deposited graphene. In some embodiments, the total pressure is increased to 500 mTorr during all or a portion of the methane flow, which can be maintained for a period such as 15 minutes. After graphene formation, the processing chamber can be filled with argon or other suitable inert gases prior to removal of the substrate for characterization.

As illustrated in FIG. 4, after the substrate is placed in a reduced pressure environment, an optional flow of hydrogen gas (412) can be used in generating an RF hydrogen plasma in the processing chamber (414).

It should be appreciated that the specific steps illustrated in FIG. 4 provide a particular method of growing graphene according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
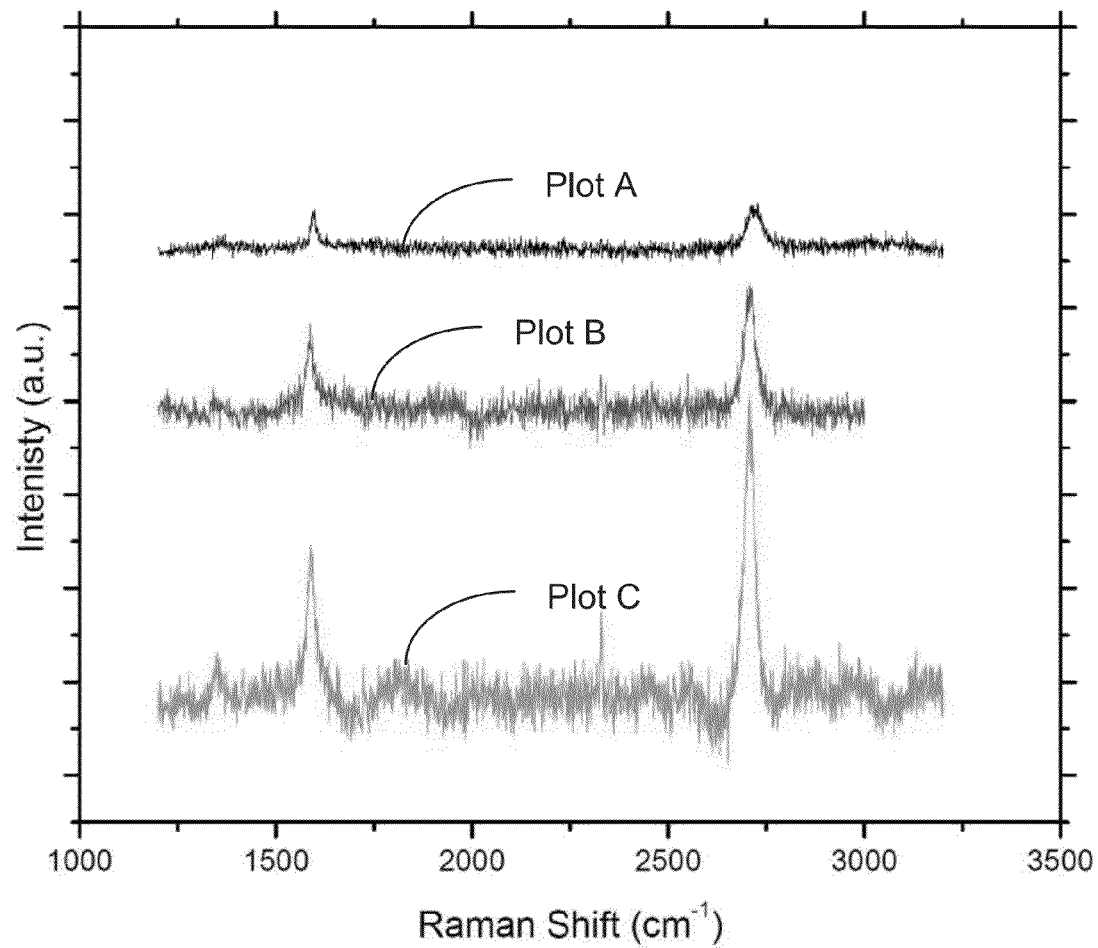
FIG. 5 shows data for a graphene film grown using conventional techniques and for a graphene film grown using another embodiment of the present invention.

FIG. 5 shows data for a graphene film grown using conventional techniques and for a graphene film grown using another embodiment of the present invention. As illustrated in FIG. 5, the Raman spectra for graphene grown using conventional techniques (i.e., single crystal copper substrate with growth performed at 1,000° C.) is plotted as plot A. Plot B illustrates the Raman spectra for graphene formed on a copper foil after plasma cleaning followed by growth at 800° C. Plot C illustrates the Raman spectra for graphene formed on copper foil using the method illustrated in FIG. 4, i.e., an RF plasma clean process followed by room temperature deposition of the graphene. The graphene films used for the data collection in FIG. 5 were all grown using 35 sccm of $CH_4$ and 2 sccm of $H_2$, with a growth time of 15 minutes under 500 mTorr total pressure. As illustrated in FIG. 5, the graphene grown at room temperature (i.e., 24° C.) and 800° C. have similar Raman spectra to graphene grown by thermal CVD at 1,000° C. The two sharp features of the Raman spectra at ~1580 and 2700 $cm^{-1}$ and the absence of a pronounced defect peak at ~1350 $cm^{-1}$ indicate that both films are of good quality.

Some embodiments of the present invention utilize one of several methods to treat the substrate surface prior to growth. As an example, a copper foil substrate can be cleaned using low temperature processes, producing a build-up of copper on the inside of the quartz processing tube, which is evidence of copper removal from the foil during the cleaning process and preparation of the growth surface for graphene production. In some embodiments, metrology can be performed to measure the level of copper deposition on the inside of the processing chamber, for example, near the substrate, and thereby determine the status of the substrate and/or as a result of the Evenson cavity plasma treatment. One substrate cleaning process utilizes an RF hydrogen plasma created adjacent the copper surface. As will be evident to one of skill in the art, an RF plasma is a vacuum process that ionizes gas molecules with high frequency voltages. The energetic and reactive species in the plasma can then serve to clean or etch a surface by removing the native surface layer or surface contaminants. Some embodiments of the present invention utilize a low temperature RF plasma process that does not entail the high temperatures normally associated with a hydrogen anneal.

In one implementation, an Evenson cavity was used as the plasma source, with an excitation frequency of 2450 MHz. The Evenson cavity can excite discharges in both static and flowing gases at pressures ranging from a few mTorr to several hundred Torr. A benefit of this particular RF microwave cavity is that it can be placed directly on a quartz vacuum tube to generate a plasma in situ.

In addition to copper substrates, other substrates are suitable for use with embodiments of the present invention, including nickel, platinum, iron, aluminum, cobalt, ruthenium, magnesium oxide, alloys of these materials, silicon, silicon carbide, combinations thereof, and the like.

In addition to the use of RF plasmas for pre-growth or one-step growth surface treatment, other surface preparation methods can be utilized, including chemical methods such as an acid etch; mechanical methods such as physical machining, ion beam bombardment, ultrasonic cleaning, polishing, laser ablation, abrasion, physical etching; chemi-mechanical methods such as reactive ion etching, electropolishing, argon plasma etching; electronic methods such as electron beam exposure, electron beam heating, inductive heating, joule heating; and electrochemical methods.

Figure 6:
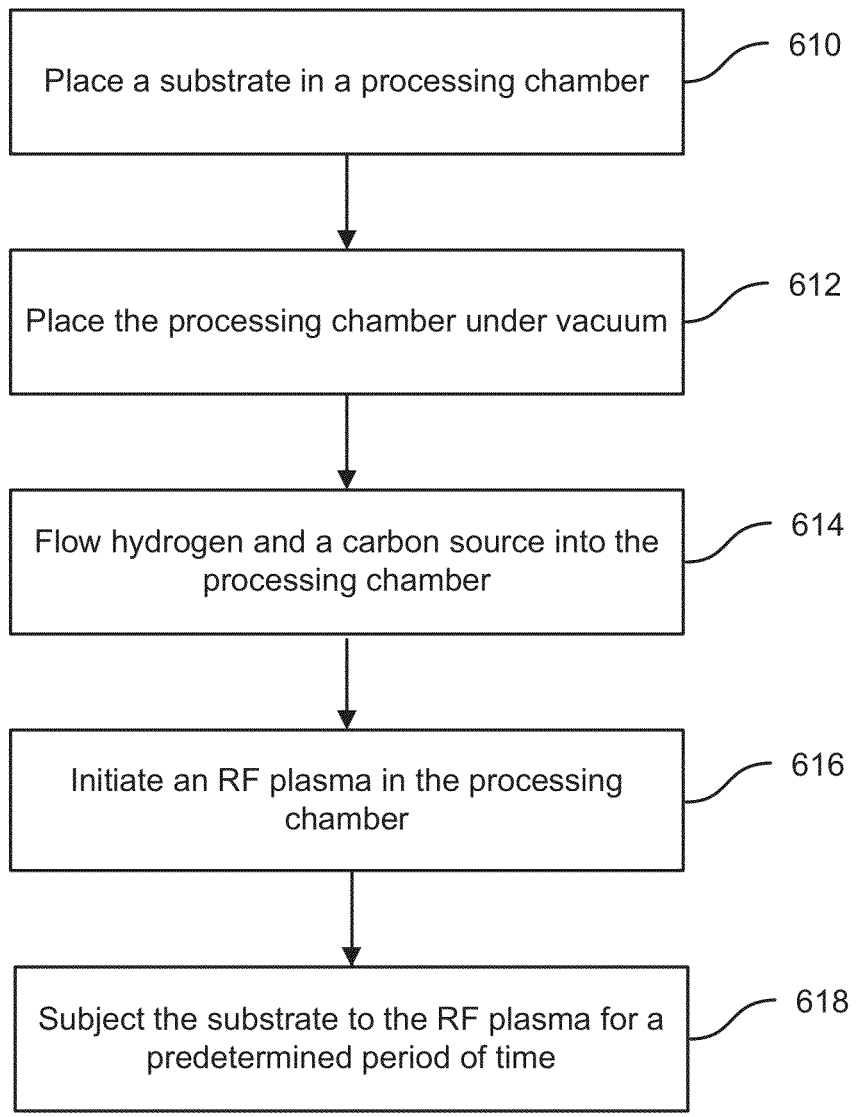
FIG. 6 is a simplified flowchart illustrating a method of growing graphene according to yet another embodiment of the present invention.

FIG. 6 is a simplified flowchart illustrating a method of growing graphene according to yet another embodiment of the present invention. The graphene formation method illustrated in FIG. 6 shares some similarities with the method of graphene formation illustrated in FIG. 4. Accordingly, description related to the method illustrated in FIG. 4 is applicable to the processes and materials described in relation to FIG. 6 as appropriate. One of ordinary skill in the art would recognize many variations, modifications, and alternatives.

As illustrated in FIG. 6, embodiments of the present invention provide a method for growing high quality, large area graphene (e.g., a graphene film) at reduced temperature in a single step. In summary, the method includes subjecting a substrate (e.g., a copper foil) to a hydrogen plasma containing trace amounts of methane. The process is performed in a reduced pressure environment. Beneficially, the process avoids the high temperature hydrogen anneal used in conventional graphene growth and the associated multiple processing steps. In this manner, growth of high quality graphene can occur in one step, at reduced temperatures, and without the need for high temperature hydrogen annealing.

Referring to FIG. 6, the method includes placing a substrate (e.g., copper foil) in a processing chamber (610). In an embodiment, the processing chamber is a quartz tube with an inside diameter of 10 mm and an outside diameter of 12.5 mm. The method also includes placing the processing chamber under vacuum, for example, a pressure less than or equal to 500 mTorr. (612). A flow of a carrier gas (e.g., hydrogen) is introduced into the processing chamber, for example, a flow rate of $H_2$ of between 2 sccm and 5 sccm, for example, 2 sccm, and a flow of trace amounts of a carbon source (e.g., methane) is added to the flow of the carrier gas, for example, a flow rate of $CH_4$ of 0.0008 sccm (i.e., 0.04% of the hydrogen flow rate) (614). The pressure in the processing chamber is stabilized at a predetermined value, for example, less than or equal to 500 mTorr, and the method includes initiating an RF plasma in the processing chamber (616), using, for example, an input power of 40 W using an Evenson cavity, which can create the RF plasma in the vicinity of the substrate. In some embodiments, the amount of the carbon source is a small fraction of the gas flow, for example, less than 0.6%, for example, between 0.01% and 0.6%. In some implementations, the amount of the carbon source is greater than 100 ppm. Thus, embodiments of the present invention provide an RF plasma of hydrogen containing trace amounts of methane as a carbon source. In addition to Evenson cavities, other plasma sources can be utilized according to embodiments of the present invention, for example, inductively coupled plasma sources or the like. The gases in the plasma can also be varied, for example, a plasma including argon ions, a plasma including chlorine ions and methane-based radicals, combinations thereof, such as chlorine, argon, and methane, and the like. Moreover, heated wire (e.g., hot wire) filament techniques can be used to create reactive species suitable for graphene growth in a process analogous to the plasma-based graphene growth techniques discussed herein. Combinations of plasma techniques and heated wire filament techniques are also included within the scope of the present invention.

In addition to the use of hydrogen as the carrier gas, other carrier gases can be utilized, including nitrogen, argon, other noble gases, chlorine, other halogens, mixtures of these gases (e.g., chlorine and argon), and the like. In addition to the use of methane as the carbon source, other gases can be utilized, including acetylene (ethane, $C_2H_2$), 2,2-dimethylpropane (neopentane, $C_5H_{12}$), allene (propadiene-$C_3H_4$), ethane ($C_2H_6$), 1,2-butadiene ($C_4H_6$), ethyl acetylene (1-butane-$C_4H_6$), 1,3-butadiene ($C_4H_6$), ethylene (ethene-$C_2H_4$), isobutane (2-methylpropane-$C_4H_{10}$), n-hexane ($C_6H_{14}$), n-butane ($C_4H_{10}$), 1-butene ($C_4H_8$), methyl acetylene (propane-$C_3H_4$), cis-2-butene ($C_4H_8$), isopentane (2-methylbutane or 3-methylbutane-$C_5H_{12}$), trans-2-butene ($C_4H_8$), n-pentane ($C_5H_{12}$), isobutylene (2-methylpropane-$C_4H_8$), propane ($C_3H_8$), cyclopropane ($C_3H_6$), propylene (propene-$C_3H_6$), dimethylacetylene (2-butane-$C_4H_6$), toluene ($C_7H_8$), dimethyl ether ($C_3H_6O$), vinyl acetylene, or the like.

The method further includes subjecting the substrate to the RF plasma for a predetermined period of time, for example, 15 minutes (618), during which the flow of the carrier gas and the carbon source are continued while still operating at a reduced pressure. In some embodiments, a fan or other cooling device (e.g., flowing air cooled by flowing through a tube having liquid nitrogen) was applied to the region of the processing tube in which the RF plasma is formed, reducing the temperature of the processing environment, for example, to temperatures less than room temperature. As an example, such cooling can reduce the temperature of the outside of the processing chamber (i.e., the quartz tube) to 90° C. or other comparable temperatures. Thus, embodiments of the present invention may refer to room temperature growth of the graphene film, but the present invention is not specifically limited to growth at 24° C., but can include other comparable temperatures. Thus, room temperature, for the purposes of this disclosure, is intended to include processing environments in which there is no external heating of the substrate other than heat that can be generated as a result of the RF plasma process. In fact, as discussed above, cooling of the substrate and the region of the processing chamber adjacent the substrate can be used to remove a portion or all of the heat generated during the RF plasma process.

In the method illustrated by FIG. 6, the addition of trace amounts of methane or other carbon sources to the hydrogen plasma can create reactive carbon species such as $C^+$, $CH^+$, $CH_2^+$, and $CH_3^+$ in the plasma. These reactive species, in addition to atomic hydrogen, result in the deposition of graphene on the substrate as the simultaneous removal of copper oxide and the deposition of graphene occurs. Without limiting embodiments of the present invention, the inventor believes that the graphene growth process includes the concurrent or simultaneous removal of the copper oxide from the substrate surface, which exposes the substrate surface to the reactive carbon species that catalyze on the surface, leaving a graphene layer.

After formation of the graphene layer, the plasma is extinguished, the processing chamber is back-filled with argon to atmospheric pressure, and the substrate is removed from the processing chamber. The inventor has noted that a the process illustrated in FIG. 6, a significant amount of copper is observed in the vicinity of the microwave cavity as a consequence of the RF plasma removing the native copper oxide layer originally present on the substrate surface.

It should be appreciated that the specific steps illustrated in FIG. 6 provide a particular method of growing graphene according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
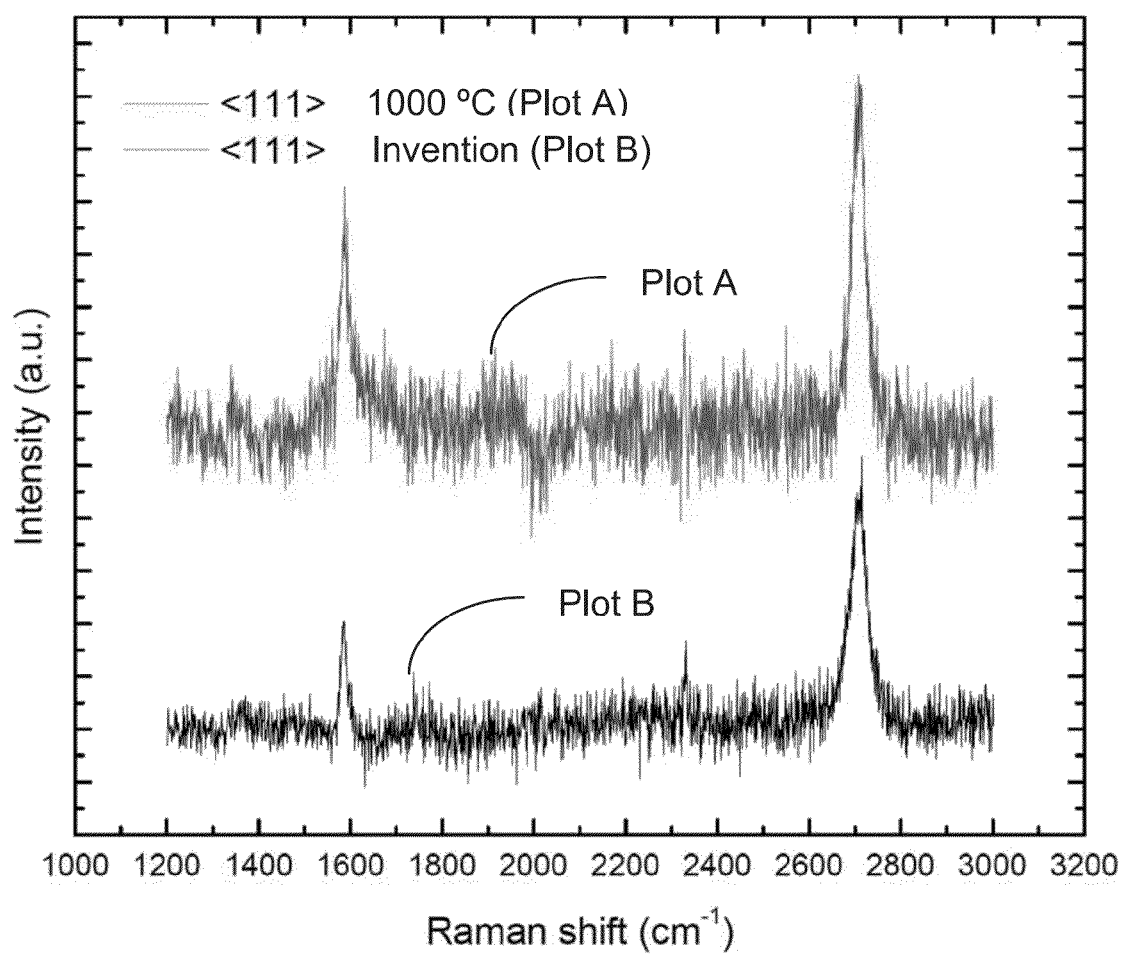
FIG. 7 shows data for a graphene film grown using conventional techniques and for a graphene film grown using an embodiment of the present invention.

FIG. 7 shows data for a graphene film grown using conventional techniques and for a graphene film grown using an embodiment of the present invention. As illustrated in FIG. 7, plot A illustrates the Raman spectra for a conventional growth process performed at 1,000° C. Plot B illustrates the Raman spectra for the single step, room temperature growth process described in relation to FIG. 6. Plot B illustrates the Raman spectra for the single step, room temperature growth process described in relation to FIG. 6. Both films were grown on single crystal copper. The two features of the Raman spectra at ~1580 and 2700 $cm^{-1}$ and the absence of a pronounced defect peak at ~1350 $cm^{-1}$ indicate that both films are of good quality.

Figure 8:
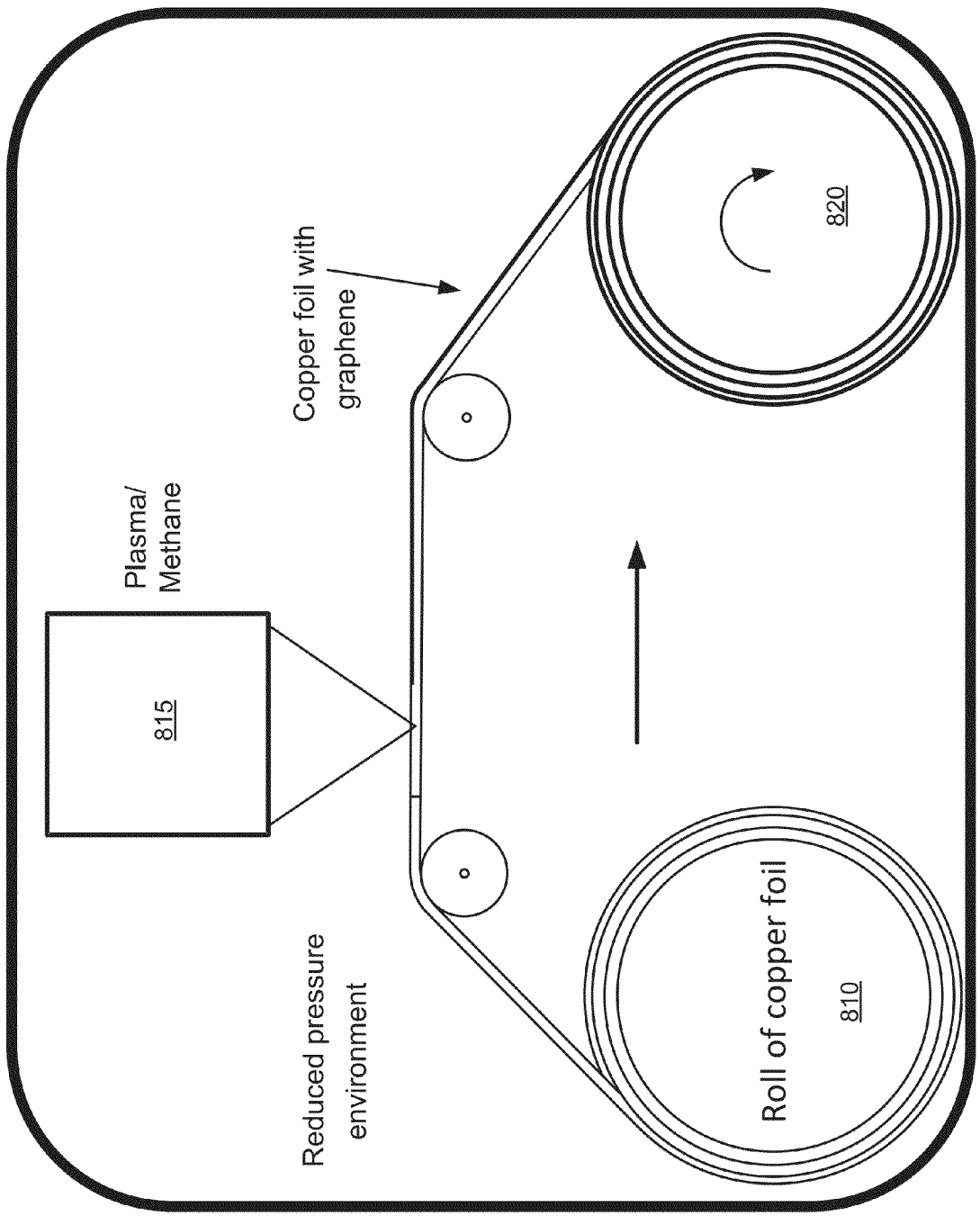
FIG. 8 is a simplified schematic diagram of a continuous roll-to-roll system for graphene production according to an embodiment of the present invention.

FIG. 8 is a simplified schematic diagram of a continuous roll-to-roll system for graphene production according to an embodiment of the present invention. As illustrated in FIG. 8, the roll-to-roll system for producing graphene includes a roll of copper foil 810 that is subjected using processing element 815 to a plasma (e.g., an RF hydrogen plasma) either followed by or concurrent with a gas jet of methane to form a layer of graphene. The copper foil with graphene is then rolled onto the output roll 820. Using the embodiment illustrated in FIG. 8, the roll-to-roll process can be used for continuous production of large area graphene films. A reduced pressure atmosphere is provided at least in the processing region but can also include the rolls of either or both copper foil and copper foil with graphene. It will be appreciated that the roll-to-roll process illustrated in FIG. 8 is applicable to one or more of the methods of graphene production described herein. In FIG. 8, graphene is illustrated as formed on the front surface of the copper foil, however, it will be appreciated that the graphene can be formed on the back surface of the copper foil or both surfaces, depending on the particular implementation. Additionally, a support or capping structure can be used to modify the residence time of the species and/or precursors adjacent the growth surface.

Although FIG. 8 illustrates a roll-to-roll process using copper foil substrates and methane as the carbon source, other substrates and carbon sources, as described throughout the present specification, are included with the scope of the system illustrated in FIG. 8. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method of forming a film of graphene, the method comprising:
placing a substrate on a holder in a processing chamber at a reduced pressure, wherein the processing chamber includes at least one atmospheric gas;
performing a room temperature surface treatment process on at least a portion of the substrate;
providing a carbon containing material in the processing chamber;
exposing the substrate to the carbon containing material; and
converting, at room temperature, a portion of the carbon containing material to a film of graphene.

2. The method of claim 1 further comprising providing a gas and exposing the substrate to the gas prior to performing the room temperature surface treatment process.

3. The method of claim 2 wherein the gas is hydrogen.

4. The method of claim 3 wherein the room temperature surface treatment process comprises an RF hydrogen plasma.

5. The method of claim 1 wherein the room temperature surface treatment process comprises an RF plasma cleaning process.

6. The method of claim 1 where the substrate comprises a copper foil.

7. The method of claim 1 wherein the reduced pressure is between 25 mTorr and 500 mTorr.

8. The method of claim 1 wherein the carbon containing material comprises at least one of methane, ethane, propane, or butane.

9. The method of claim 1 wherein converting, at room temperature, the portion of the carbon containing material to the film of graphene includes subjecting the substrate to an RF plasma.

10. The method of claim 1 wherein converting, at room temperature, the portion of the carbon containing material to the film of graphene is performed concurrently with performing the room temperature surface treatment process.

11. The method of claim 1 wherein the at least one atmospheric gas comprises nitrogen gas.

12. The method of claim 1 wherein the at least one atmospheric gas comprises water vapor or oxygen.

13. The method of claim 1 wherein the room temperature surface treatment process comprises an etch process removing material from the substrate.

14. The method of claim 1 wherein the room temperature surface treatment process is performed prior to the converting, at room temperature, the portion of the carbon containing material to the film of graphene.

15. The method of claim 1 wherein the carbon containing material makes up less than 0.6% of a flow containing the at least one atmospheric gas and the carbon containing material.

16. The method of claim 15 wherein the carbon containing material makes up less than 0.1% of the flow.

17. The method of claim 1 wherein a ratio of a first Raman peak associated with defects to a second Raman peak associated with graphite is less than one.

18. The method of claim 1 wherein the substrate has a front side opposite a backside and the backside is adjacent to the holder, wherein the film of graphene is formed on the backside of the substrate.

19. A method for forming graphene, the method comprising:
providing a substrate;
subjecting the substrate to a reduced pressure environment including at least one atmospheric gas;
providing a carrier gas;
providing a carbon source;
exposing at least a portion of the substrate to the carrier gas including the at least one atmospheric gas and the carbon source;
performing an etching process on the at least a portion of the substrate; and
converting, concurrently with the performing the etching process and at room temperature, a portion of the carbon source to graphene, wherein graphene is disposed on the at least a portion of the substrate.

20. The method of claim 19 wherein the substrate comprises a copper foil and the etching process comprises removal of copper from the copper foil.

21. The method of claim 19 wherein the reduced pressure environment comprises a vacuum environment between 25 mTorr and 0.5 Torr.

22. The method of claim 19 wherein the carrier gas comprises hydrogen.

23. The method of claim 19 wherein the carbon source comprises methane.

24. The method of claim 19 wherein providing the carrier gas and providing the carbon source are performed concurrently.

25. The method of claim 24 wherein the carbon source makes up less than 0.6% of a flow containing the carrier gas including the at least one atmospheric gas and the carbon source.

26. The method of claim 25 wherein the carbon source makes up less than 0.1% of the flow.

27. The method of claim 19 wherein the etching process is performed at a pressure less than or equal to 500 mTorr.

28. The method of claim 19 wherein the at least one atmospheric gas comprises nitrogen gas.

29. The method of claim 19 wherein the at least one atmospheric gas comprises water vapor or oxygen.

30. The method of claim 19 wherein a ratio of a first Raman peak associated with defects to a second Raman peak associated with graphite is less than one.

* * * * *

UNITED STATES PATENT AND TRADEMARK OFFICE
CERTIFICATE OF CORRECTION

PATENT NO. : 9,150,418 B2
APPLICATION NO. : 13/774188
DATED : October 6, 2015
INVENTOR(S) : David A. Boyd Page 1 of 1

It is certified that error appears in the above-identified patent and that said Letters Patent is hereby corrected as shown below:

IN THE SPECIFICATION

Column 5, line 42, replace "subjected" with subjecting.

Column 9, line 42, after "adjacent" insert -- to --.

Column 12, beginning at line 11 thru line 13, delete the entire sentence (second occurrence), "Plot B illustrates the Raman spectra for the single step, room temperature growth process described in relation to FIG.6.".

Signed and Sealed this
Twenty-second Day of March, 2016

Michelle K. Lee
*Director of the United States Patent and Trademark Office*